US007771787B2

(12) United States Patent
Velegol et al.

(10) Patent No.: US 7,771,787 B2
(45) Date of Patent: Aug. 10, 2010

(54) PARTICLE LITHOGRAPHY METHOD AND ORDERED STRUCTURES PREPARED THEREBY

(75) Inventors: Darrell Velegol, State College, PA (US); Jason D. Feick, Auburndale, MA (US); Allison M. Yake, Landenberg, PA (US); Charles E. Snyder, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 1355 days.

(21) Appl. No.: 11/211,312

(22) Filed: Aug. 25, 2005

(65) Prior Publication Data

US 2010/0170612 A1    Jul. 8, 2010

Related U.S. Application Data

(60) Provisional application No. 60/604,765, filed on Aug. 26, 2004.

(51) Int. Cl.
*B05D 7/00* (2006.01)
(52) U.S. Cl. ...................................... 427/212; 427/221
(58) Field of Classification Search ................. 427/212, 427/214
See application file for complete search history.

(56) References Cited

U.S. PATENT DOCUMENTS 6,589,629 B1 *   7/2003   Bao et al. .................... 428/144
6,846,578 B2     1/2005   Kumacheva et al.
2003/0157260 A1 * 8/2003   Rubner et al. ............... 427/402

OTHER PUBLICATIONS

Cayre et al., "Fabrication of Asymmetrically Coated Colloid Particles by Microcontact Printing Techniques," J. Mater. Chem., 13, 2445-2450 (Sep. 2, 2003).*
Wang et al., "Template-directed colloidal self-assembly—the route to 'top-down' nanochemical engineering," J. Mater. Chem., 14, pp. 459-468 (Jan. 13, 2004).*
Nakahama et al., "A Novel Preparation of Nonsymmetrical Microspheres Using the Langmuir-Blodgett Technique," Langmuir, 16, 7882-86 (Sep. 21, 2000).*
Wang et al., "Template-directed colloidal self-assembly—the route to 'top-down' nanochemical engineering", J . Mater . Chem., 2004 , 14 , 459-468.
Smith et al., "Quantum Dot Nanocrystals for In Vivo Molecular and Cellular Imaging", Photochemistry and Photobiology: vol. 80, No. 3, pp. 377-385 (2004).
de Hoog et al., "Direct observation of crystallization and aggregation in a phase-separating colloid-polymer suspension", Physical Review E, vol. 64, 021407 (2001).

(Continued)

*Primary Examiner*—Michael Cleveland
*Assistant Examiner*—Robert Vetere
(74) *Attorney, Agent, or Firm*—Gifford, Krass, Sprinkle, Anderson & Citkowski, P.C.; Douglas L. Wathen

(57) ABSTRACT

Particles having a non-uniform property, such as non-uniform charge, can be used to form complex yet controlled particle assemblies. In one method of fabrication, particles are located on a substrate, and a surface treatment applied to the exposed portion of the particle surface. The surface treatment modifies the particle properties within the exposed portion. One or more lithographed regions are not exposed to the surface treatment, providing spatial selectivity in inter-particle bonding after the particles are removed from the substrate.

33 Claims, 6 Drawing Sheets

OTHER PUBLICATIONS

Moon et al., "Multiscale Nanopatterns Templated from Two-Dimensional Assemblies of Photoresist Particles", Adv. Mater. 2005, 17, 2559-2562.

Cayre et al., J., Mater. Chem., 13, 2445, (2003).

Choi et al., J. Am. Chem. Soc., 127, 1636 (2005).

Zhang et al., "Patterning microsphere surfaces by templating colloidal crystals", Nano Lett. 2005, 5(1), 143.

Snyder et al., "Nanoscale Functionalization and Site-Specific Assembly of Colloids by Particle Lithography" Langmuir 2005, 21, 4813-4815.

* cited by examiner

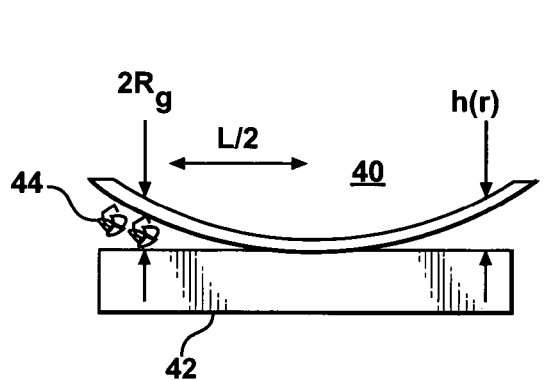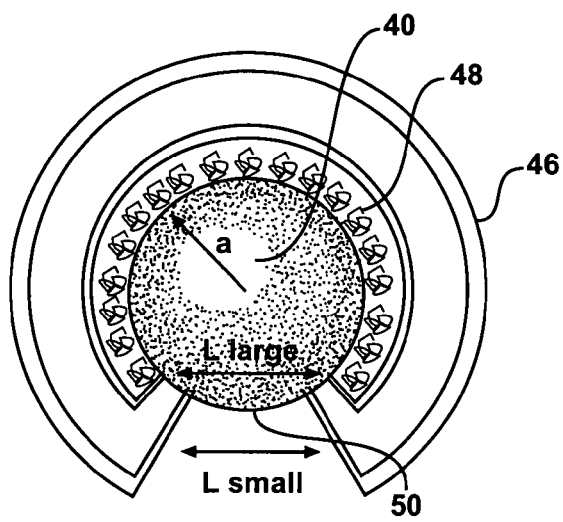
FIG - 2A  FIG - 2B
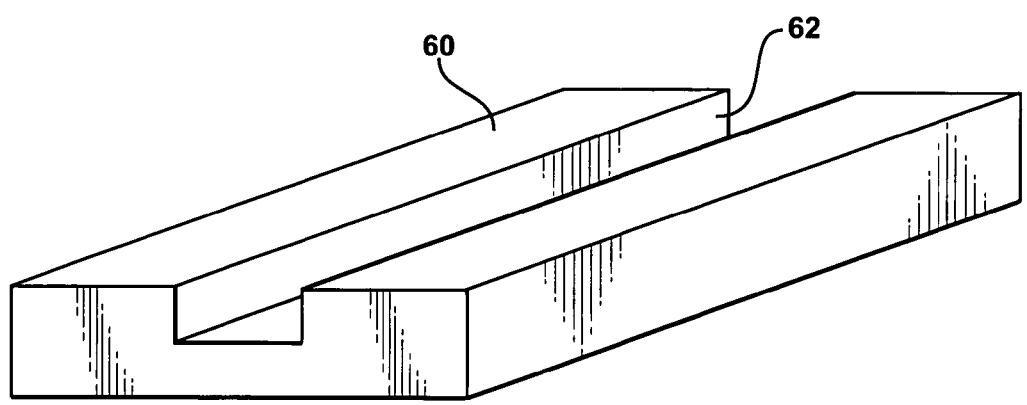
FIG - 6A

PARTICLE LITHOGRAPHY METHOD AND ORDERED STRUCTURES PREPARED THEREBY

REFERENCE TO RELATED APPLICATION

This application claims priority of U.S. Prov. Pat. App. Ser. No. 60/604,765, filed 26 Aug., 2004, which is incorporated herein by reference.

GRANT REFERENCE

The research carried out in connection with this invention was supported by National Science Foundation, Grant Nos. CTS-9984443, CCR-0303976. The U.S. Government may have rights in this invention

FIELD OF THE INVENTION

The present invention relates to particles having non-uniform properties, particle assemblies, and methods of formation thereof.

BACKGROUND OF THE INVENTION

Particle assemblies have been formed by others during the preparation of synthetic opals, photonic materials, and other materials. Colloidal crystals, ceramics, synthetic opals, and photonic materials have been formed from assemblies of spherically symmetric particles.

The structures are typically low information, meaning that little information is required to specify the placement of all components in a structure. For colloidal crystals, the typical amount of information is only two or three parameters. For example, close packed arrays of spheres, all spheres having the same composition, have been formed using conventional methods. The particles were densely packed and consisted only of particles with the same size and material. Other close-packed particle aggregates have been formed using emulsion techniques.

However, new approaches are required to produce more complex particle assemblies, including colloidal assemblies with more complex compositions and structures. To our knowledge, techniques do not yet exist for creating site-specific chemistry at any desired location on individual colloidal particles.

SUMMARY OF THE INVENTION

Methods are presented for forming particles having controlled non-uniform properties, and formation of particle assemblies including such particles. Methods according to embodiments of the present invention are capable of creating controlled nanoscale spatial variations over the surface of microscale or nanoscale particles. These methods allow bottom-up assembly of more complex materials, such as particle assemblies having controlled and reproducible geometry.

A colloid is a suspension of small particles dispersed in a fluid, and the term colloidal molecule can be used to describe an assembly of colloidal particles with specified composition, structure, and other assembly information (e.g., particle-particle adhesion energies). Interactions between particles can be highly controlled, and become analogous to chemical bonds, allowing formation of complex structures. In one representative example, heterodoublets, having two dissimilar particles bound together by a bonding interaction, were prepared in high yield using particle lithography. More complex assemblies may be formed through multi-step processes.

Interactions and bonding between particles may result from: electrostatic or magnetic forces; covalent, ionic or other chemical bonds between surface species; controlled variations in hydrophobicity; receptor-ligand interactions; immunological interactions; complementary DNA interactions, protein-protein interactions; van der Waals forces; or other interaction.

The term particle lithography is used to describe a method according to an embodiment of the present invention of forming a site-specific non-uniformity in a particle property. These non-uniform properties have a spatial distribution largely or completely determined by the lithography process, and are not merely random distributions. A coating layer, such as a polyelectrolyte, polymer, fullerene, alkane-thiol, or other layer, covers the surface of the lithographed particle (the particle that has a controlled variation of one or more properties), except for portions (lithographed regions) that are masked by the substrate. The substrate may be flat glass, silicon V block, another particle, or other structure that masks off a portion of the lithographed particle, for example by contact with or proximity to the lithographed particle.

In examples of the present invention, a masking process is used in which a substrate masks off a lithographed region of a particle. The non-uniformity can then control, at least in part, the formation of particle assemblies, allowing particle assemblies having a controlled geometry, that may uniform, non-uniform, anisotropic, or other desired form. For example, a plurality of particle assemblies having a substantially uniform geometry may be formed and isolated, in contrast to random aggregations.

Particle properties, which may be made non-uniform using methods according to the present invention, include surface charge, surface chemistry (for example, non-uniform spatial distribution of functional groups), physical properties such as optical or electromagnetic properties, and the like. Other example may include surface topography, chemical composition, and the like.

Methods according to embodiments of the present invention can be used to form nanoscale regions of non-uniformity (e.g. a charged or chemically functionalized region) on particles having micron-scale sizes. For example, particles may have sizes of less than 100 microns, more specifically less than 1 micron. Particle may be nanoscale, for example having a size range of 2 nm-100 microns, more specifically 10 nm-5 microns.

A method of preparing particles having a non-uniform property, each particle having a particle surface, comprises locating the particles on a substrate, exposing the particles to a surface treatment, the surface treatment modifying the particle properties within an exposed portion of the particle surface, but not within one or more lithographed region of the particle surface. The lithographed region is shielded from the surface treatment by proximity to the substrate, which includes contact with the substrate and possibly a surrounding region. After this process, which may be termed particle lithography, the particles are removed from the substrate, for example by agitation, sonication, chemical degradation, release from magnetic field, or other method.

The surface treatment may be a formation of a coating layer (for example including a polymer, polyelectrolyte or a surfactant), which substantially reduces the surface charge of the particle during particle lithography. In this case, after release of the particles from the substrate, the originally lithographed regions of the particles have a substantially greater surface charge, and these form bonding regions to which other particles can bond through electrostatic forces. Hence, particle assemblies can be made having a structure defined by the location of the lithographed regions.

A method of creating particle assemblies comprises providing a first particle having a non-uniform property; providing one or more second particles, and allowing the first particle and the second particles to interact so as to form a particle assembly. The interaction may include mutually attractive or repulsive forces, for example electrostatic attraction, DNA base-pair attraction, hydrophobic attraction, receptor-ligand attraction, or other attraction. The first and second particles may have the same or different composition, dimensions (such as sphere or cylinder diameter, cube or other polyhedron edge length, or cylinder length), or other properties. One or more second particles then bond with each of the first particle, the geometry of the particle assembly being determined by the non-uniform property of the first particle. For example, the first particle may have one or more bonding regions having a different (possibly opposite) charge than other (non-bonding) regions of the particle surface, for example due to a coating layer on the non-bonding region. If the second particles have an opposite charge from the bonding regions of the first particles, electrostatic bonds are formed with the first particles, allowing considerable geometry uniformity within a given production batch if desired. Anisotropic assemblies can be readily formed, and the geometry of the particle assemblies can be modified by changing the particle lithography conditions. The particle assemblies can then be isolated, for example in a colloidal solution or in the solid state.

A method for making an ordered structure comprises providing a first particle having a non-uniform charge distribution thereupon, the first particle having a first region which is in a first charge state and a second region which is in a second charge state which is different from the first charge state; providing a second particle having a charge which corresponds to the first charge state of the first particle; and disposing the first particle and the second particle in proximity to one another whereby the charge on the second particle causes it to electrostatically bond to the second region of the first particle so that the adhered particles provide the microstructure. Examples include other non-uniform regions, including regions having receptor-ligand pairs, complementary DNA pairs, hydrophobic regions, and other functionality.

A particle lithography method for making a particle having a non-uniform charge distribution comprises providing a particle having a first charge state; providing a substrate having a second charge state which is different from the first charge state; disposing the particle in proximity to the substrate so that the particle is electrostatically adhered to the substrate; providing a polyelectrolyte material having a charge state which is the same as the charge state of the substrate; contacting the electrostatically adhered particle with the polyelectrolyte whereby the polyelectrolyte selectably forms a coating layer on an exposed portions of the particle not in contact with the substrate, so as to produce a partially coated particle which is adhered to the substrate; and removing the partially coated particle from the substrate.

In another example, the coating layer comprises fullerenes, such as hydroxyl-functionalized $C_{60}$ buckyballs. The coating layer might also comprise other small colloids or nanocolloids. In further examples, alkane-thiol coating layers can be used with metal particles like gold or silver, and polymer surface materials may be used with many types of particles.

Particle assemblies according to the embodiments of the present invention have many possible applications, for example optical materials (such as photonic crystals), ceramics, electronic materials and devices, and the like.

BRIEF DESCRIPTION OF THE DRAWINGS

FIGS. 2A and 2B are schematics illustrating control of the size of the lithographed region;

FIGS. 6A-6E illustrates particle lithography using a rectangular channel;

DETAILED DESCRIPTION

Figure 1A:
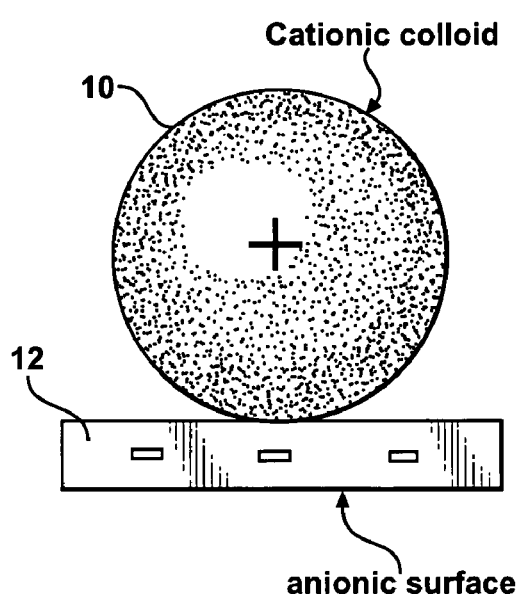
FIGS. 1A-1D show a particle lithography method according to an embodiment of the present invention.
Figure 1B:
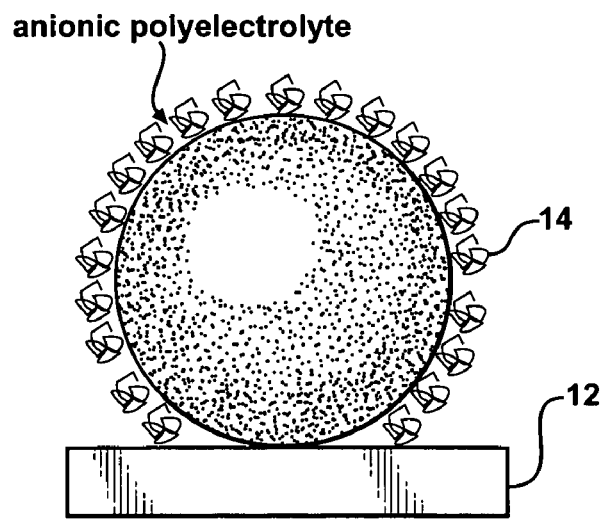

Structures assembled according to embodiments of the present invention comprise assemblages of small particles, including colloidal particles. Particles may have a size (diameter in the case of spheres) in the range 2 nm-100 microns or greater, such as 0.25-10 microns, and in more specific instances a size in the range of 0.5-5 microns. The range used depends on the application of the particle lithography technology. In other instances, embodiments of the present invention may be adapted to the fabrication of nanostructures comprised, at least in part, of particles having nanoscale sizes typically ranging from 2 nanometers up to 100 nanometers. In accord with a further aspect of the present invention, these particles are patterned by a particle lithography process. The patterned features are typically in the range of 1-1000 nm in size, depending on the particle size and other factors, and, as explained herein, allow the particles to be assembled into structures such as particle assemblies having a predetermined geometry.

Materials according to embodiments of the present invention are prepared through the interaction of particles, at least some of which have a non-uniform charge distribution. As noted above, the particles typically have a size in the colloidal or nanoscale range. The principles of the present invention may be adapted for use with particles of organic (e.g., polymer particles, hydrogel particles) and inorganic materials (e.g., oxides such as silica or titania, metals such as gold or palladium, or semiconductors such as cadmium selenide or cadmium sulfide).

Particle assemblies may be formed through a binding reaction such as electrostatic interaction. At least some of the particles employed as the basic building blocks of the structures may have a net electrical charge. Structures of the present invention may be based upon the use of particles manipulated to have a non-uniform charge distribution, that is to say particles having at least two separate regions which differ in terms of their charge state. As is understood herein, charge state refers to a region having a positive or negative electrical charge and can also include a neutral, uncharged, region. As will be appreciated by those of skill in the art, particles having regions with different charge states can interact so as to selectively bind together to form various structures. For example, a particle having a non-uniform charge distribution in which a first region is in a first charge state, such as a positive charge state, and a second region is in a second charge state, such as a negative charge state, can be put in proximity with another particle having, for example, a uniform positive charge. This second particle selectively bonds to the negatively charged portion of the first particle so as to produce a structure which may be termed a colloidal molecule, which may be nanocolloidal molecule comprising an assembly of nanoparticles. In this manner, diverse materials can be joined together to provide novel aggregations of properties. As will be appreciated by those of skill in the art, other such binding arrangements involving different charge distributions and types may be implemented.

While the foregoing has described systems in which a particle has two areas of differing charge, it will be appreciated that particles having more complicated charge asymmetries may also be employed in the use of the present invention, and this allows for the fabrication of still more complex colloidal molecule structures. More complex colloidal molecules may include multi-layers of coating, formed during multiple stages of assembly, which by analogy is like an organic molecule synthesis process having perhaps over a dozen steps.

A localized, nanoscale charge distribution on the surfaces of individual particles, such as colloidal microspheres, was achieved using particle lithography. In this method, parts of the particles are masked off, while polyelectrolytes (or other species such as polymers, fullerenes, or alkane-thiols) cover the remaining portions of the particle. The effectiveness of this process was demonstrated by the accurate and reproducible production of colloidal heterodoublets composed of oppositely charged microspheres. The particle lithography technique is not limited by the resolution of conventional photolithography or by functionalizing chemistries, and the technique allows complex site-specific functionalization of particles.

The technique of particle lithography allows localized and nanoscale functionalization of particles, with improved flexibility in the placement of the functionalized regions. A spherical particle starts with no preferred orientation, so there is no way to identify a specific side of the sphere. However, using particle lithography, functionalized regions of chosen size can be placed on controlled relative locations on a sphere, or other shape such as a cylinder, ellipsoid, or cube. A single functionalized region, such as a localized and nanoscale region of different charge, can be placed on particles, such as micrometer-sized polystyrene latex (PSL) microspheres. The effectiveness of this process is demonstrated by the accurate and reproducible assembly of colloidal heterodoublets composed of oppositely charged microspheres. Clusters of particles, such as heterodoublets, may be termed colloidal molecules.

Particles having a non-uniform charge distribution may be prepared by various techniques. In general terms, a particle lithographic technique for electrostatic bonding is carried out by first electrostatically binding a particle to a substrate, and in this regard, the particle and substrate have differing charge states. A coating layer comprising an electrically charged masking material, such as a polyelectrolyte, is electrostatically bonded to a portion of the particle. The coating layer may have a charge which is the same as the charge on the substrate. In this manner, the coating layer only binds to portions of the particle not in contact with the substrate. The bound particles are then released from the substrate, as for example by sonication, or a chemical means such as degrading a polymer between the particle and substrate. This results in the fabrication of a structure comprising a particle bearing a first charge and having a coating layer bearing a second charge partially covering the surface of the particle. The resultant structure thus exhibits a controlled charge non-uniformity.

Particle assemblies can be formed from first, second, and further particle species. Some or all of the particle species particles can be lithographed, and indeed lithographed differently, for example if using complementary DNA (ACGT nucleotides) for particle bonding, as one particle may have a region with A nucleotides on it, while another may have a region with T nucleotides.

Figure 1C:
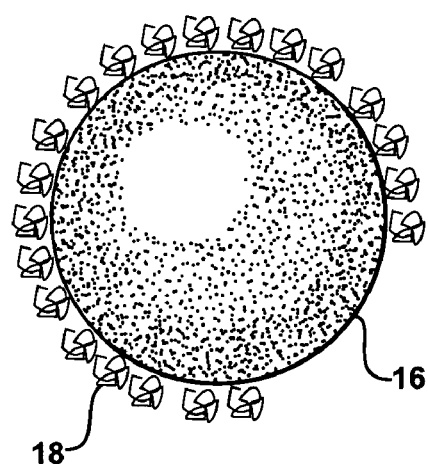
Figure 1D:
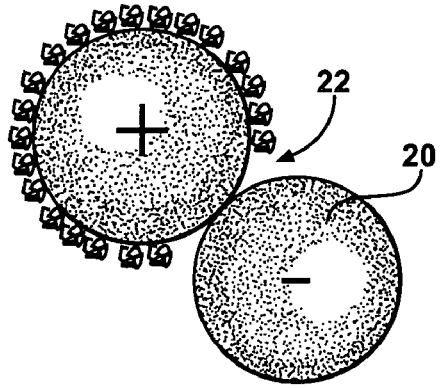

FIGS. 1A-1D illustrate particle lithography using a plane substrate. Particle 10 is located on a substrate 12. In this example, the particle has an intrinsic positive surface charge, and the substrate has an anionic surface. A surface treatment is provided, which in this example gives a coating layer of anionic polyelectrolyte over the exposed surface of the particle. A lithographed region of the particle, around the point of contact or closest proximity to the substrate, does not have the coating layer. The particle is then removed from the substrate, as shown in FIG. 1C. The lithographed region 16 now provides an electrostatic bonding region, to which a second particle 20 can bond through an electrostatic interaction, as shown in FIG. 1D, to form a particle assembly.

FIGS. 2A and 2B are schematics demonstrating the control of the effective size of the lithographed region. FIG. 2A shows a portion of particle 40 located on substrate 42, with coating layer 44. The lithographed region size can be controlled by both the particle radius (a) and the polyelectrolyte radius of gyration ($R_g$). For a particle of radius a and a polyelectrolyte of radius $R_g$, simple geometric considerations show that the diameter L of the lithographed region is given by $L \approx 4(aR_g)^{1/2}$. This results from the fact that the height h(r) between a sphere and a flat plate, at any distance (r) from the contact point between the particle and the plate, is given by $h(r) \approx r^2/2a$. The polyelectrolyte is mostly excluded from the region where $h < 2R_g$, and this gives a region of radius L/2 where no polyelectrolyte adsorbs. Accordingly, decreasing the particle radius (a) or the polyelectrolyte size ($R_g$) makes the lithographed region smaller.

FIG. 2B illustrates that the Debye length around the polyelectrolyte affects the effective size of the lithographed region, making L seem smaller. The effective size of the lithographed region can be manipulated by altering the particle size, the polyelectrolyte size, and the Debye length. A larger Debye length (i.e., in a solution with lower ionic strength) effectively closes off part of the lithographed region, the outermost part of the lithographed region, because the effect of the adsorbed polyelectrolyte extends further from the particle, as represented schematically by arc 46. A smaller Debye length is indicated schematically by arc 48 around coating layer 48. A larger Debye length also increases the accuracy of assembly, although it decreases the rate of formation. The lithographed region is shown at 50.

By adjusting the Debye length parameter, greater selectivity may be obtained. On a qualitative level, controlling the Debye length affects access to the lithographed region of the particle. The lithographed region may be chemically functionalized, or comprise a region of different sign electrostatic charge to the surrounding non-lithographed regions of the particle surface. Furthermore, the pH of the solution may be adjusted to yield a neutral charge in the lithographed region (e.g., a carboxyl lithographed region amidst a sulfonated coating layer at roughly pH of 2), yielding a hydrophobic region on the particle.

The particle lithography technique enables site-specific chemistry on particles with significant flexibility. The particles do not have the random charge non-uniformity observed on untreated particle surfaces, but instead can have nanoscale regions of designed chemistry. The placement of the regions depends on the shape of the substrate. The substrates may include but are not limited to flat glass surfaces. For example, silicon V-blocks (silicon with V-shaped channels) were used for lithographing, and other polymer colloid particles were used as a lithographing substrate. Thus, the substrate material and topography can be varied as desired. Substrates may also comprise metals or other materials.

In the example below, a simple flat glass surface was used as the lithographing substrate, and electrostatic forces were used for the bonds between particles in the colloidal molecules. Other lithographically defined surfaces can be used to selectively mask site-specific and multiple areas on particles. For example, using a different substrate such as V-block grooves, an assembly of three particles can be created in the geometry of a water molecule, having an arbitrary bond angle determined by the substrate topography.

The placement of the lithographed regions can be determined by the substrate topography, enabling anisotropic, non-close-packed, and three-dimensional particle assemblies. Other approaches to inter-particle bonds can be used, such as various binding chemistries.

Temperature may also be varied, both during synthesis of the particle assemblies, and may also include prior annealing of particles to reduce any intrinsic charge non-uniformity.

EXAMPLES

Particle lithography was used to produce a single functionalization (a localized and nanoscale region of different charge) on micrometer-sized polystyrene latex (PSL) microspheres. The effectiveness of this process was demonstrated by the accurate and reproducible assembly of colloidal heterodoublets composed of oppositely charged microspheres.

The general approach was also successfully performed using a number of different substrates, coating layers, particle types, and binding interactions, as described in more detail below.

Poly(styrene sulfonate) (PSS, MW of about 70 000) and potassium chloride (KCl, MW 74.55) were purchased from Aldrich Chemicals, U.S.A. Deionized (DI) water was used for all experiments and washing steps (Millipore Corp. Milli-Q system) had a specific resistance greater than 1 MΩ (i.e., "equilibrium water"). Amidine and sulfate functionalized PSL microspheres were used (Interfacial Dynamics Corp., Portland, Oreg.), as well as silica microspheres (Bang's Laboratories, Fishers, Ind.). The ultrasonicator and Pyrex Petri dishes were obtained from VWR International.

Amidine particles (positively charged) adhered to a negatively charged glass slide in water. A negatively charged PSS polyelectrolyte ($R_g$~10 nm) was introduced, which covered the amidine particles except in a lithographed region close to the glass plate where the PSS could not access, which may also be referred to as the lithographed region. The particles were sonicated off the glass slide, exposing the lithographed region, in this example a nanoscale positively charged region on the surface of the particles. The coating layer was apparently not removed nor altered by sonication or diffusion. Negative particles (silica or sulfated latex particles) were introduced, which adhered selectively to the positively charged region on the amidine PSL particles. Particle heterodoublets were formed by this process.

A more detailed description of this process follows for the particle lithography technique to produce high yield and high selectivity heterodoublets. First, 20 mL of DI water was added to a 10 cm diameter Pyrex Petri dish. To the Petri dish containing DI water was added 60 microliters of 1.5-micron amidine functionalized PSL microspheres with 8% solids. The Petri dish was briefly agitated to disperse the particles throughout the entire volume, and then the particles were allowed to settle for 24 h. The positively charged particles adhered to the negatively charged Petri dish by an electrostatic attraction. Optical microscopy indicated that a particle monolayer was formed. The excess liquid and unsettled particles were decanted off, and the dish was washed three times with 10 mL of DI water to remove any unadhered particles. The result was a monolayer of 1.5 micron amidine PSL particles electrostatically adhered to the glass Petri dish surface.

Next, 20 mL of a 10 micromolar PSS solution was added. This negatively charged polyelectrolyte was allowed to adsorb to the amidine functionalized PSL particles for 12 h to ensure that the particles were completely coated. The excess PSS solution was then poured out of the Petri dish, and the adhered particles were washed with a 30 mM KCl solution to remove any excess PSS. An additional 10 mL of the 30 mM KCl solution was then added to the adhered particles. The Petri dish was sonicated to remove the adhered amidine microspheres from the glass surface.

In this example, the particle lithography method produced particles having a single, nanoscale, positively charged region (i.e., because the original particle was amidine). These precursor particles were used to form self-assembled heterodoublet particles. Negatively charged microspheres of silica or sulfated PSL particles were added to the solution of the lithographed amidine microspheres in a ratio of approximately 1:1. The negatively charged particles electrostatically bound to the exposed positive lithographed regions on the amidine microspheres to form heterodoublets. In this example, the size of the lithographed region was L≈350 nm, giving the fractional area of the lithographed region compared with the total PSL particle area of approximately 1.3%.

Figure 3:
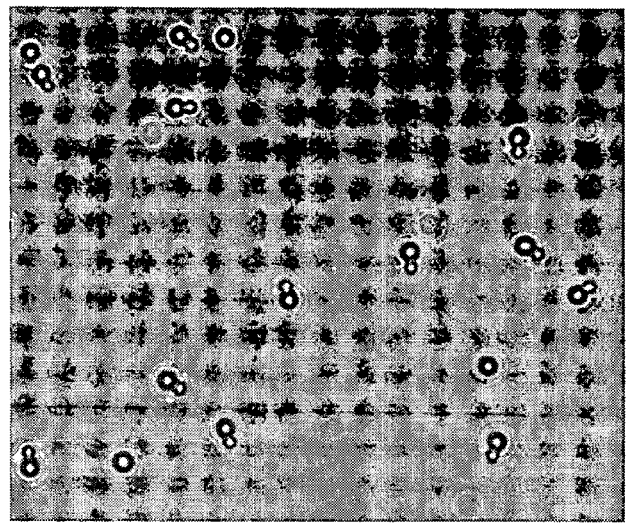
FIG. 3 shows heterodoublets formed by a particle lithography process.

FIG. 3 shows heterodoublets formed by the above process. FIG. 3 shows an optical microscopy image (40×) of a purified heterodoublet suspension of 1.5 micron amidine PSL and 2.4 micron sulfate PSL particles, showing the accurate formation of colloidal doublets.

Figure 4:
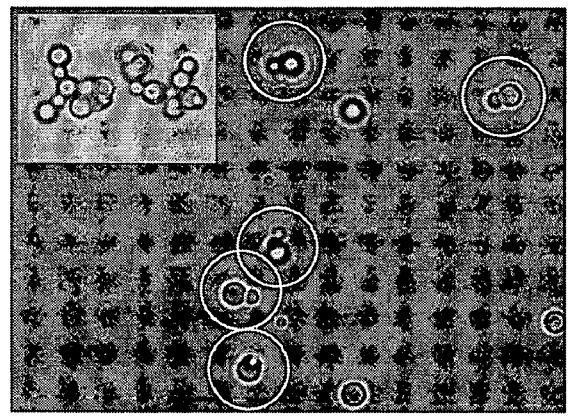
FIG. 4 further illustrates heterodoublets formed using particle lithography, with an inset showing random aggregation that occurs in the absence of particle lithography.

FIG. 4 also illustrates heterodoublets formed using particle lithography. The doublets were made from sulfated latex particles (negative) and amidine particles (positive). The main portion of the image shows high-yield, high-accuracy heterodoublets formed using particle lithography. The inset shows the uncontrolled aggregation that occurs between particles without use of particle lithography. Without particle lithography, amidinated and sulfated latex particles aggregate into random formations.

EDC (1-Ethyl-3-(3-dimethylaminopropyl)-carbodiimide) coupling chemistry was also used to covalently bind silica particles to polystyrene latex particles to form heterodoublets. The results, under optical microscopy, were similar to those shown in FIGS. 3 and 4. Also, the biotin-avidin chemistry was used to form a bond between two particles (in a heterodoublet) using a similar approach.

In another example, using otherwise similar experimental conditions, hydroxyl functionalized $C_{60}$ buckyballs were used as the surface layer, acting in a manner analogous to a negative polyelectrolyte. Again, the results were similar to those shown in FIGS. 3 and 4.

Figure 5:
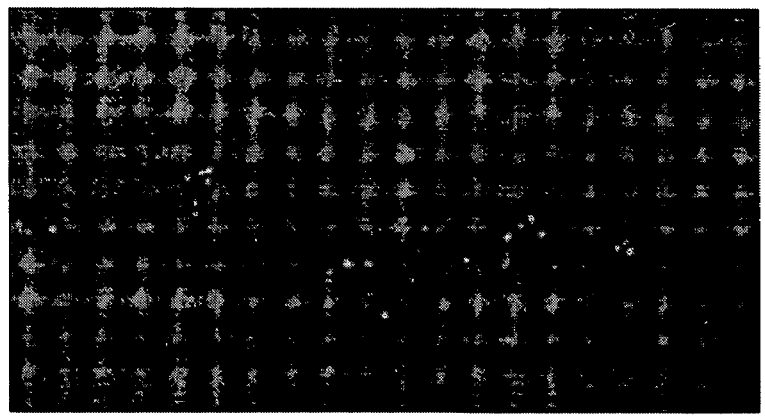
FIG. 5 further shows large random aggregates formed when particle lithography is not used.

FIG. 5 shows a further optical microscope image of the large random aggregates formed without particle lithography.

Further purification of the heterodoublet suspension was achieved in this case using zonal centrifugation. Extensive measurements of heterodoublet yields have were made using optical microscopy. Typically, 40% of the PSS lithographed single particles, or singlets, ended up as heterodoublets after 24 h For the heterodoublets discussed above in relation to FIG. 3, the yield was estimated to be 41±6% before purification. In general, the yield of heterodoublets is less important than the accuracy of the particle lithography process, because the isolation of the heterodoublets from the singlets and other aggregates can be achieved using zonal centrifugation or other method.

Separation can be accomplished by density gradient centrifugation, where care is taken to eliminate the formation of electrostatic gradients by adding salt to the gradient solution. Separation may also be done using microfluidic networks, or any other method.

For heterodoublets made from two different types of material (e.g., silica-PSL doublet), isopycnic separation techniques allowed simple purification. The carrier solvent is chosen to have a density intermediate between the less dense and more dense particles, such that one rises and one falls during centrifugation. Based on the accuracy of the colloidal doublet synthesis, excellent accuracy is expected for more complex aggregates. The centrifuge tube may further be coated on the interior surface to avoid a meniscus, to help prevent particles from settling into a rim near the tube walls If the two types of PSL particles (positively and negatively charged) are mixed without using the particle lithography technique, the particles quickly aggregate into large random aggregates (as expected, and shown in FIG. 4).

The lithographed particles were quite stable in de-ionized (DI) water due to the large Debye length. The particles have been stored for over a month, with no assembly until salt is added. Only when the salt concentration was raised above 15 mM KCl did significant numbers of heterodoublets form for the 1.5-micron amidine/2.4-micron sulfate combination, and only when the salt concentration was above 10 mM KCl did significant numbers of heterodoublets form for the 1.5-micron amidine/1.0-micron sulfate combination.

The synthesis of heterodoublets using the particle lithography technique was specific and accurate. Nanoscale functionalization and site-specific assembly can be achieved through control of the polyelectrolyte size, the Debye length, and the particle size.

Substrates

The substrate or substrates may comprise one or more depressions, such as channels or wells. For example, the substrate may comprise an array of channels (as used here, the term includes grooves and other elongate depressions in a substrate), such as square or triangular channels formed in a glass or other substrate, or a V-block (triangular grooves) on a silicon wafer. The channels allow assembly of particles into trimers, which may have a structure analogous to water molecules. The substrate may also include wells, such as square wells sized to allow assembly of a pentamer. The wells can also be other shapes, including triangles of various shapes, pentagons, or other shapes.

Figure 6C:
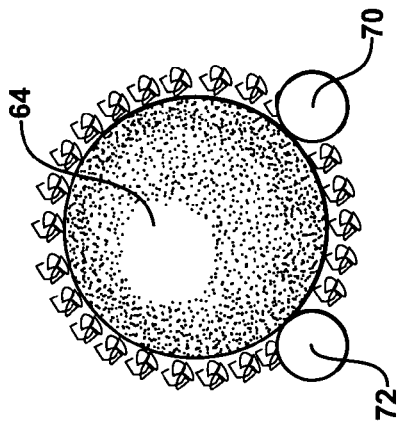

FIGS. 6A-6E illustrates particle lithography using a rectangular channel. FIG. 6A illustrates a rectangular channel 62 in a substrate 60.

Figure 6E:
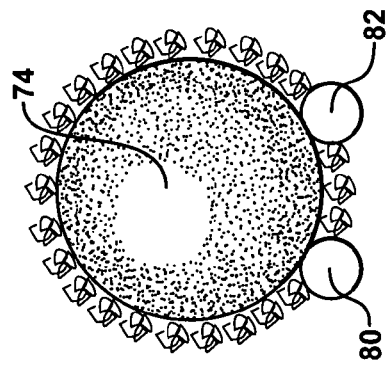
Figure 6B:
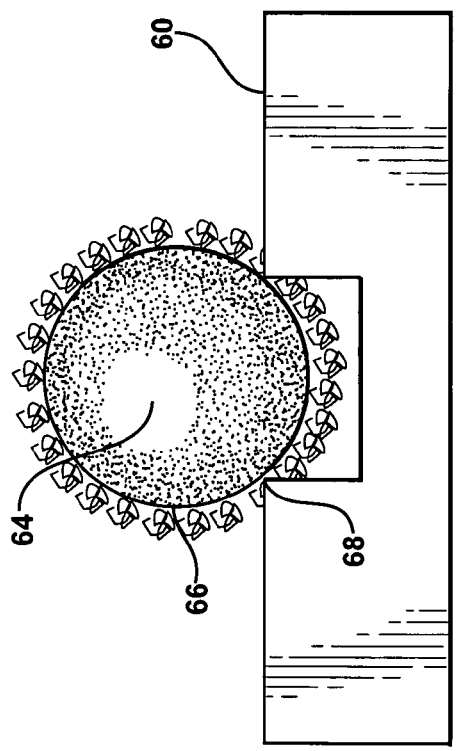

FIG. 6B illustrates particle lithography of a particle 64 located on the substrate, partially within the channel. The channel width is less than the diameter of the particle 64. As shown, particle lithography produces two lithographed regions (such as 68) on the particle surface, around the two points of contact between the particle and the substrate. The lithographed region is uncoated with the coating layer 66.

A substrate having a rectangular channel allows formation of three-particle assemblies. FIG. 6C shows two heteroparticles 70 and 72 bound to the two lithographed regions, which are the bonding regions, on the surface of the particle 64. This form of colloidal molecule can be referred to as a colloidal water assembly, because of the geometry of the particle assembly, not because of the chemical composition.

Figure 6D:
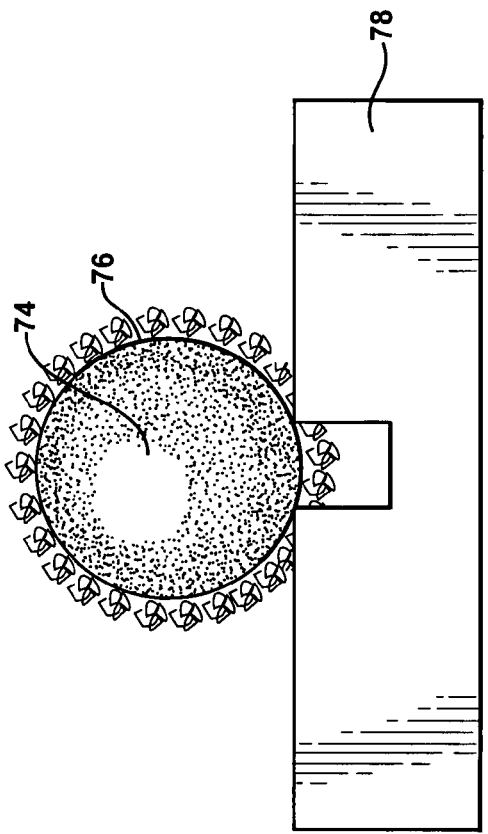

FIGS. 6B and 6D illustrate that the width of the channel can be adjusted to make the two heteroparticles (80 and 82) bound to particle 74 closer or farther apart, i.e. to adjust a parameter that may be referred to as the bond angle of the colloidal molecule (again, the terminology refers to the spatial structure of the assembly). FIG. 6D illustrates the particle 74 sitting on a narrower channel than shown in FIG. 6B. FIG. 6E shows the resulting colloidal molecule, having a reduced bond angle. The bond angle is the angle between two axes joining the centers of the bound particles.

Figure 7A:
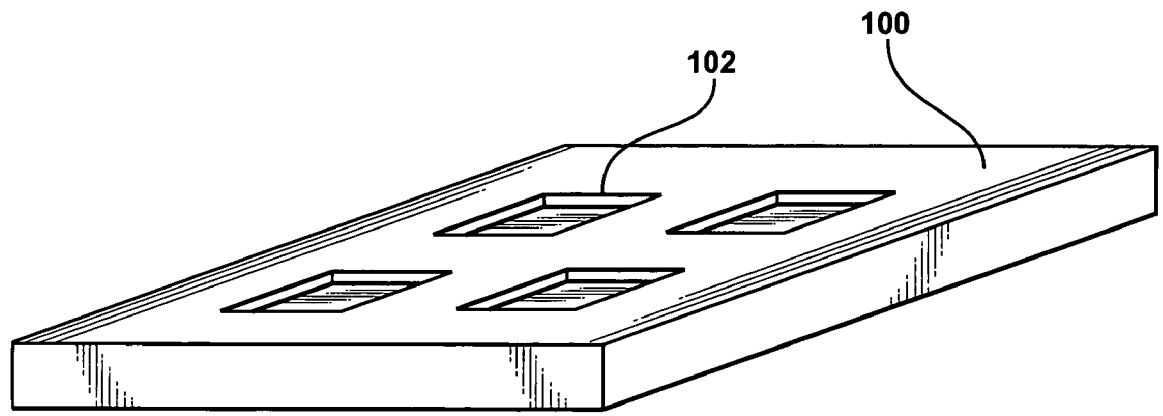
FIGS. 7A-7C illustrate particle lithography using a substrate topography comprising square wells.
Figure 7B:
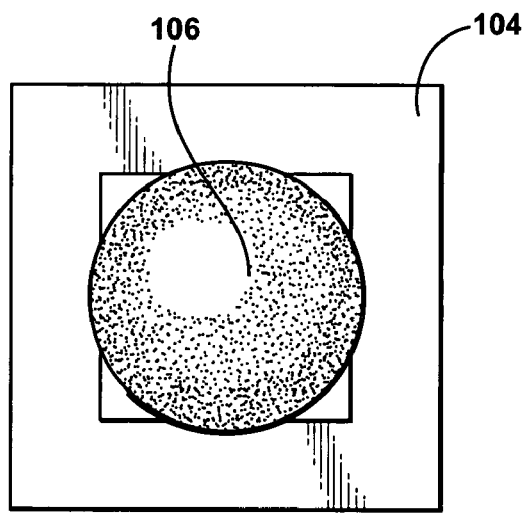
Figure 7C:
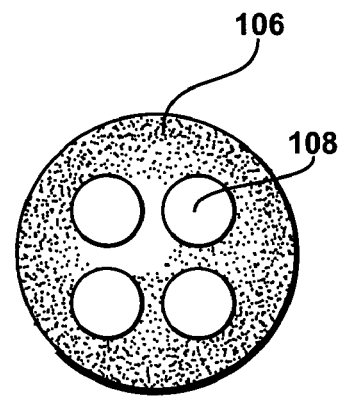

FIGS. 7A-7C illustrate particle lithography using a substrate topography comprising square wells. FIG. 7A shows a square well 102 in substrate 100. FIG. 7B shows a particle 106 located on the substrate, centered within a square well. The particle contacts the substrate in four locations (possibly 5, if the particle also contacts the base of the well). FIG. 7C shows a five-particle assembly comprising the particle 106, and four smaller heteroparticles such as 108. The dimensions of the well, relative to the particle radius, can be altered to make the heteroparticles closer or further apart, modifying a parameter that may be referred to as a bond angle. Such channels or wells can be formed in glass or other substrates using conventional lithography processes. Wells may also be anisotropic (e.g. rectangular), or other shapes. A similar result may be obtained using a square pillar array.

Substrates may take the form of sheets, meshes (for example, to allow the surface treatment to be applied from opposed directions), fibers, pillar arrays, and the like. Substrates may have an electrostatic charge chosen to attract particles to the substrate, and sometimes particles may be attracted to the surface by other forces, such as magnetic. The electrostatic charge may be reversed to assist removal of the particles, or in the magnetic example, the magnetic field may be removed.

By use of an appropriately configured substrate, more complicated structures may be prepared. For example, the substrate may comprise a V-grooved surface configured so that a particle rests at least in part in the groove. In this manner, two separate regions of each particle contact the substrate, and when the masking and removal operations are carried out, the result is a particle having three separate regions, wherein two of the regions have one charge state and a third has a different charge state. Use of otherwise configured substrates allows for the preparation of still further configured charge distributions. In other examples, the substrates themselves may comprise colloidal or nanoscale sized particles.

In another example, particles themselves were used as the substrate material for each other. By salting out particles such that only homodoublets form (by quenching the aggregation quickly using DI water, for example), the doublets were lithographed and sonicated apart to give two lithographed particles. This approach is highly scalable to industrial production quantities. A single particle type may act as both the lithographed particle and the substrate. Similarly, each one of a number of interacting particles of same or different types may act as a substrate for lithography of another. In other examples, a separate particle species can be used as a substrate. Particles used as substrates may be retained as lithographed particles, or may be separated and discarded.

Figure 8:
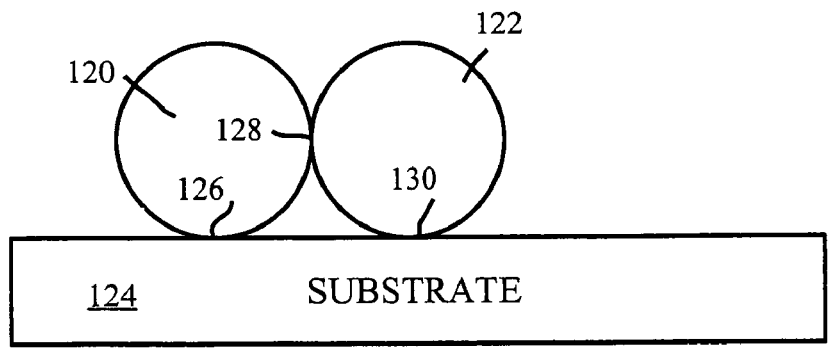
FIG. 8 shows lithography of a particle assembly.

FIG. 8 shows first and second particles 120 and 122, bound together as a doublet at point of contact 128. The doublet is located on substrate 124. In this case, particle lithography can be used to form a lithographed particle assembly (a doublet in this example), having lithographed regions where masked by the substrate at 126 and 130. Alternatively, the doublet can be split apart, to provide the first particle having lithographed regions at 128 and 126, the second particle similarly having two lithographed regions. In the latter example, each particle acted as a substrate for each other for the particle lithography process, along with the planar substrate 124.

Particles may be removed from the substrate by agitation, sonication, scraping, substrate bending, stretching, or other mechanical methods, electrical methods (such as electrostatic repulsion), magnetic methods, dissolution or otherwise destroying the substrate, polymer degradation, or other method. The substrate may have a degrading layer on the surface thereof, which can be degraded by any chosen method, such as chemical degradation, to facilitate release of the particles from the substrate. A degrading layer can be used with particle substrates, in some cases to facilitate separation of the lithographed particles by sonication or other method.

Particles (for example, in suspension) may also be used as the substrate for particle lithography. In one approach, homo-doublets are formed in suspension (i.e. two particles made from the same material), and the surface treatment (lithographing agent or coating layer such as a polyelectrolyte) coat both except where they touch. The particles can the be separated. Multiple particles, such as three particles, may also function as the substrate, including colloidal molecule doublets (including heterodoublets with two different particles).

Multiple substrates may also be used simultaneously, including mixed substrates. This might include using a V-block substrate beneath the particles, which can lithograph two regions, and a flat glass substrate placed on top of the particles, to give one additional region. The substrates are not used to stamp the particles, but to provide lithographed regions as described in this patent. Furthermore, particles may be used as substrates as described in the paragraph above, and simultaneously the aggregates can rest on a flat glass substrate to provide an additional lithographed region on each particle. This system can be sonicated to remove particle doublets from the surface, and further the particle doublets may be sonicated apart, giving two lithographed regions on each particle.

By allowing particles to settle to one substrate, and then placing another substrate on top, the top and bottom of a particle can be lithographed. As another example, by forming doublets, and then allowing the doublets to settle on to a substrate, lithography is possible using two substrates simultaneously. The particles act as a substrate for each other, and the flat glass acts as a substrate for both. Sonication removes the doublets from the surface, and possibly break apart the doublets, giving two lithographed regions on each particle.

Substrates may comprise glass, silicon, metal, polymer, or any other material. Substrate charge state may be varied, if appropriate, to assist attraction or release of particles.

In another example, polymer colloids with ferromagnetic cores can be used. When a magnetic field is applied externally, all the particles move to a flat glass substrate and are held there during the particle lithography step. To release the particles, the magnetic field is removed. For example, the magnetic field may be provided by an external permanent magnet or electromagnet.

Other Bonding Approaches

EDC (1-Ethyl-3-(3-dimethylaminopropyl)-carbodiimide) coupling chemistry was also used to covalently bind silica particles to polystyrene latex particles. Other covalent chemistries, biotin-avidin interactions (which were used successfully), complementary DNA binding, and other specific biochemical interactions can be used to form colloidal molecules. Reversible interactions, complementary DNA binding, protein-protein interactions, any molecular recognition interaction, and other specific biochemical interactions also allow formation of particle assemblies. The properties of the lithographed regions can be controlled to be the only functionalized regions on the particle surface. For example, the coating layer may remove surface functionality in the non-lithographed regions.

Other binding reactions, such as antibody/antigen reactions, hapten reactions, nucleotide binding reactions, other covalent binding reactions, and the like may be employed in the practice of embodiments of the present invention. In another approach, hydrophobic regions allow particles to bond within an aqueous or other polar medium. Furthermore, for metallic lithographed regions, high electric fields can be applied and the metal regions come together first due to induced electrical attraction. Covalent binding through carbodiimide reactions has been used to assemble very small particles into ordered structures. The particle lithography techniques described herein may be readily adapted by one of skill in the art for use in such other embodiments.

Bond regions can be provided on arbitrary locations of a particle, the particles can then be stored in suspension, and then allowed to bond with other particles a by changing solution conditions, or in some cases, external electromagnetic fields. Methods according to the present invention are scalable to large quantities.

Coating the entire surface of a charged particle stabilizes a suspension of the particles, but then the coating interferes with self-assembly of the particles. Methods according to the present invention provide a surface coating over most, but not all, of the particle surface, giving directed charge non-uniformity, and stabilizing suspensions, while at the same time allowing self-assembly of particle assemblies through the uncoated regions of the particle.

Lithographed regions having spatially defined functionality can be made by various approaches. In one example, a particle is provided with functionality over the entire particle surface. Particle lithography is then used to mask off or otherwise nullify the functionality over all but the lithographed region, for example through application of a coating layer to the particle. In another approach, particle lithography is used to cover all but the lithographed layer with a coating layer. The lithographed layer is then functionalized, the coating layer preventing functionalization over the particle surface the coating layer covers. In these two examples, the lithographed region becomes the bonding region of the particle.

Medium Used for Lithography

Experiments were performed in an aqueous medium. However, other polar solvents (such as ethanol or ethylene glycol), or non-polar solvents (such as benzene, hexadecane, or decane) may be used, for example with suitably chosen polymeric coating layers.

In other examples, particle lithography may be carried out in air, inert gas (such as nitrogen or argon), or vacuum. The coating may be applied by any method, including vapor deposition processes.

The medium in which the particle lithography is performed may be changed during the process, for example from a polar to non-polar liquid medium to induce desired interactions (for example, bonding between lithographed regions of defined surface hydrophobocity). In other examples, a change in medium may be used to release particles from a substrate, dissolve unwanted substrate materials, or other reason.

Figure 9:
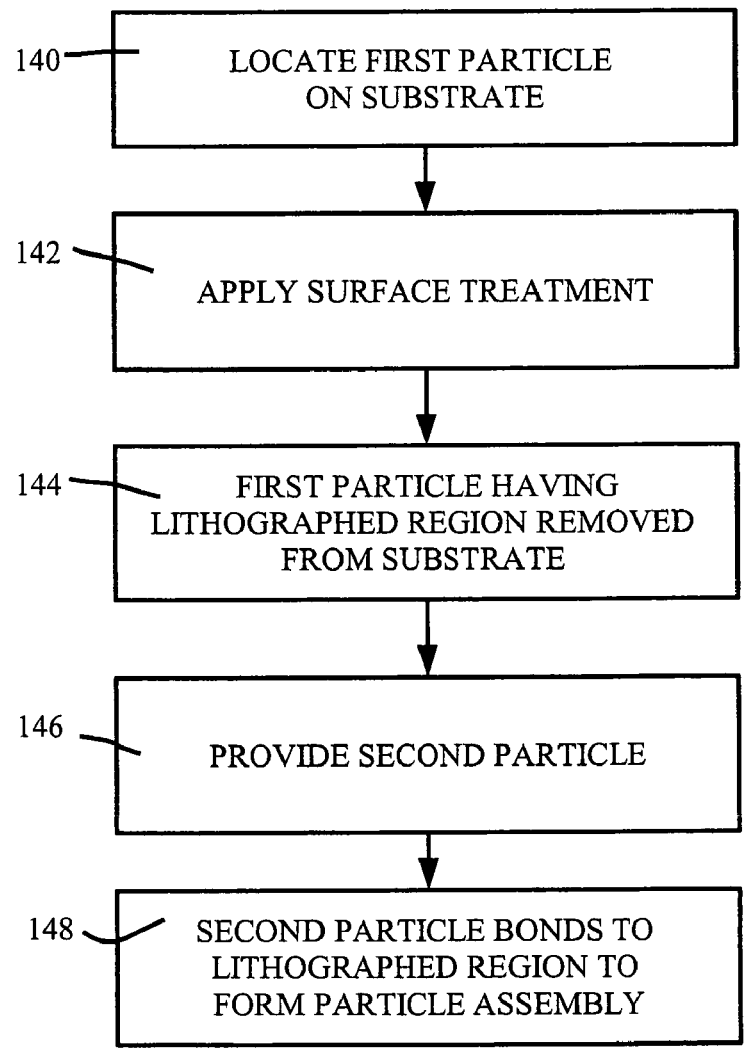
FIG. 9 is a flow chart illustrating an embodiment of the present invention.

FIG. 9 is a flow chart illustrating a method according to an embodiment of the present invention. Box 140 corresponds to locating a first particle on a substrate. Box 142 corresponds to applying a surface treatment, such as a coating layer, to exposed regions of the particle not masked by the substrate (non-lithographed regions). Box 144 corresponds to removing the first particle from the substrate, the first particle having one or more lithographed regions. Box 146 corresponds to providing a second particle. Box 148 corresponds to the second particle bonding only to the lithographed region to form a particle assembly.

Particle Composition

As used herein, the term particle includes spherical particles such as polystyrene latex particles, and also non-spherical particles. The latter include rods (such as cylinders, prisms, and the like), ovoids, and other forms. Particles may comprise one or more polymers, such as latex, polystyrene, acrylates such as PMMA (polymethylmethacrylate), and acetates such as PVA (polyvinylacetate), polystyrene butadiene, and combinations thereof.

Particles also include inorganic materials such as silica, for example, Stober silica, see for example Stober, W., Fink, A., Bohn, E., "Controlled Growth of Monodisperse Silica Spheres in the Micron Size Range." J. Coll. Interf. Sci., 26, 62-69 (1968)), titania ($TiO_2$), alumina ($Al_2O_3$), other inorganic oxides, and other inorganic materials. Particles may comprise inorganic materials such as oxides, nitrides, carbides, and the like, and combinations thereof. In yet other instances, the particles may comprise metallic particles such as particles of gold, silver, platinum, and palladium.

Inorganic particles may be synthesized so as to present, for example, one or more crystal faces presenting charge states so as to give the particle charge uniformity. For example, particles may comprise goethite iron oxide, hematite iron oxide of various shapes, and hematite with inclusions.

Particles may include semiconductor particles, such as nanoparticles (including quantum dots) and nanowires (including quantum wires), for example including selenides, tellurides, and other chalcogenides of cadmium, zinc, and/or mercury (for example, CdS, CdSe, CdTe, ZnS, and the like).

Particles may also comprise a combination (such as a composite) of organic and inorganic materials. Particles may comprise sugars or other organic compounds.

Particles may also include biological structures, such as viruses, bacteria (such as *E. coli, B. cepacia*), other cells including mammalian, nuclear structures, DNA and other biopolymers, for example in a compacted state, and the like.

Coating Layers

Coating layers may comprise a polymer (such as PEG (polyethylene glycol), PVA, or other polymer), polyelectrolyte, surfactant, fullerenes, alkane-thiols, DNA, receptor-ligand pairs, proteins, alkane-thiols or alcohols (for example, for metals), or other material partially coating the surface of a particle so as to spatially modulate a binding capability to another particle. Alkane-thiols and alcohols are well suited for use with metal particles.

The binding capability may be provided by DNA, receptor-ligand pairs, proteins, charge, other anisotropic surface property such as surface tension, or other functionality.

Surfactants may be ionic or non-ionic. Anionic polyelectrolytes include sodium polystyrene sulfonate (NaPSS, for example with MW 70 000). Cationic polyelectrolytes include poly(ethylene imine) (PEI, for example MW 750 000) and poly(allylamine hydrochloride) (PAH). Anionic surfactants include sodium dodecylbenzene sulfonate (SDBS). Cationic surfactants include cetyltrimethylammonium bromide (CTAB). Nonionic surfactants include Triton X-100.

To scale up production of colloidal assemblies, storage, appropriate bonding mechanisms (e.g. reaction chemistries), and separation of final products, such as described herein, can be used. Particles with electrostatic regions can be stored in a low-ionic strength solution.

The size of the lithographed region depends on the radius of the particle (a) and the size of the polyelectrolyte ($R_g$). For example systems, $L \approx 2\sqrt{R_g a} = 250$ nm, since $R_g = 25$ nm and a=750 nm in this example. However, the effective size of the region can be reduced by using low ionic strength solutions. When it is desired that the particles "react", the ionic strength can be raised to about 20-50 mM KCl or PBS, allowing particle assembly to occur.

The size (L) of the lithographed region is also influenced by the Debye length ($\kappa^{-1}$) or ionic strength. The polyelectrolyte can enter the gap only as far as its size allows. The Debye length can also be modified to change the effective region ($L_{small}$) where a second charged particle can touch the lithographed particle.

Coating layers may adhere to exposed portions of the particle by receptor/ligand, DNA, and other interactions. Coating layers may also include self-assembled monolayer (SAM) molecules on metal and other particles, such as alkane-thiols.

The coating layer may substantially prevent bonding to other particles, and may have other properties, such as chemical bonding or other interactions with analytes in the environment, for sensing or other applications. Thus, the lithographed particles have uses useful beyond the formation of particle assemblies.

Multi-Step Fabrication

Particle assemblies can be formed by multiple-step methods, for example using particle lithography of particle sub-assemblies, or other combination of particle sub-assemblies formed by separate particle lithography steps.

In one example, polymer homodoublets were formed by a salting out process, e.g. by raising salt concentration to 2-5M for a polystyrene colloidal solution. A quench after approximately 30 seconds prevented further coagulation, leaving singlets and homodoublets only. After the doublets settled to a flat substrate surface, a coating layer can then be applied to the doublets. Sonication can be used to remove lithographed doublets, which then readily form U-shaped particle assemblies. Higher energy sonication can be used to break apart the doublets, in which case each single particle has two lithographed regions, one from the other particle and one from the glass substrate, and each can thus form colloidal molecule having a water-like geometry.

In another example, doublets (or other particle combinations) are formed by any desired method, and particle lithography can then be performed on the doublets, allowing a more complex structure (such as a combination of 4 particles) to be formed.

Hence, the particle lithography method is not limited to single particles. Embodiments of the method can be used to create non-uniformities in pre-formed particle combinations or other assemblies, allowing more complex assemblies to be formed. Multi-stage processes allow more complex assemblies to be formed.

In other approaches, multiple substrates may be used. For example, particles in suspension and a substrate layer may be used in combination, to achieve different spatial patterning of a coating layer.

APPLICATIONS

Particle assemblies according to the present invention can be used in improved electronic materials, circuits, and devices; coatings; ceramics; metamaterials; ferroelectrics; three-dimensional barcodes; catalysts, optical materials, including photonic materials, reflective, and diffractive elements; colloidal crystals; alloys and also intermetallic compounds, for example formed using metal particle heteroassemblies including different metal particle compositions; bioactive materials; biosensors; drug delivery, environmental remediation, and the like. For example, particle assemblies can be formed having multiple functions, depending on the individual particles in the assembly. For example, a particle assembly may comprise one or particles responsive to chosen analytes.

Anisotropic particle assemblies can be formed using the present method, and bulk materials having anisotropic electrical or optical properties formed therefrom.

DNA-directed assembly of nanowires can also be facilitated, by providing bonding regions on the nanowires with which the DNA may interact. Applications further include nanoscale electronic circuits, miniature robotics, and novel catalytic assemblies. For example, logic gates can be formed using controlled interaction of rod-like particles. Applications also include development of particles and/or particle arrays for sensing a predetermined selection of analytes. For example, particle lithography can be used to determine a region of a particle surface on which a molecular receptor can be adsorbed.

Microstructures and nanostructures according to embodiments of the present invention can exhibit optical, electronic, and/or other physical properties which differ from the bulk properties of the materials of which they are made, and correlate with the geometry of the particle assemblies used. Materials according to the present invention may include bioactive materials, among other uses.

A particle assembly according to an embodiment of the present invention comprises a first particle having a particle surface, the particle surface having at least one bonding region and a non-bonding region, and a second particle forming a bond with the bonding region of the first particle. The first particle has a surface treatment, such as a coating layer, applied to the non-bonding region of the particle surface, the bonding region being a region without the surface treatment. For example, the first particle may have a size (such as diameter) of between approximately 2 nm and approximately 100 microns, the bonding region being a lithographed region formed on the first particle by a lithographic process. The second particle forms a bond with the bonding region of the first particle. The non-bonding region of the first region may be substantially incapable of bonding with the second particle, for example through having a different charge state or chemical functionality than the bonding region. The lithographed region, in this case the bonding region, may have a surface charge, so that the bond is an electrostatic bond. The non-bonding region may have a coating layer applied thereto to reduce electrostatic attraction with the second particle, possibly tending to repel the second particle. A coating layer can prevent formation of the bond between the non-bonding region of the first particle and the second particle.

For example, the particle may have an intrinsic surface charge, in the absence of any surface treatment, and the non-bonding regions may have a coating layer that electrostatically shields the surface charge, so as to substantially shield any surface charge from the non-bonding region, or provide a non-lithographed region of opposite charge. Hence, one or more additional particles, such as the second particle, can then form an electrostatic bond with the bonding region of the first particle.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. It will be understood that in view of the teaching presented herein, yet other modifications and variations of the invention will be apparent to those of skill in the art. It is the following claims, including all equivalents, which define the scope of the invention.

Patents, patent applications, or publications mentioned in this specification are incorporated herein by reference to the same extent as if each individual document was specifically and individually indicated to be incorporated by reference. In particular, U.S. Provisional Patent Application Ser. No. 60/604,765, filed 26 Aug., 2004 is incorporated herein in its entirety. Having described our invention,

We claim:

1. A method of preparing a particle having a non-uniform property, the particle having a particle surface, the method comprising:

locating the particle on a substrate, the substrate being a substrate particle;

providing a surface treatment, the surface treatment modifying the particle surface in an exposed portion of the particle surface and not modifying the particle surface within a lithographed region of the particle surface, the lithographed region being shielded from the surface treatment by proximity to the substrate, the lithographed region being a portion of the particle surface masked off by the substrate, formed as a region in contact with the substrate and a surrounding region in which proximity of the particle surface to the substrate prevents access to the particle surface by the surface treatment, and removing the particle from the substrate, so as to obtain the particle having the non-uniform property.

2. The method of claim 1, wherein the surface treatment comprises formation of a coating layer, the coating layer coating the exposed portion, the coating layer not coating the lithographed region.

3. The method of claim 2, wherein the coating layer comprises a polymer.

4. The method of claim 2, wherein the coating layer comprises a polyelectrolyte, the method further comprising adjusting an ionic strength or pH of a surrounding solution so as to control a size of the lithographed region.

5. The method of claim 2, wherein the coating layer comprises a surfactant.

6. The method of claim 1, wherein the non-uniform property is a surface charge distribution.

7. The method of claim 1, wherein the non-uniform property is a surface chemical functionality.

8. The method of claim 1, wherein the non-uniform property is a surface hydrophobicity.

9. The method of claim 1, wherein the non-uniform property is a surface biochemical functionality.

10. The method of claim 9, wherein the surface biochemical functionality is provided by a biochemical selected from the group of biochemicals consisting of proteins, and DNA.

11. The method of claim 1,
wherein the substrate includes a depression in the surface thereof:
the particle being located in part within the depression so that at least two separate regions of the particle are in contact with the substrate; and
the particle surface then having at least two lithographed regions formed by providing the surface treatment.

12. The method of claim 11 wherein the depression is a channel.

13. The method of claim 11, wherein the depression is a well, the particle surface then having three or more lithographed regions.

14. The method of claim 1, wherein the particle has a dimension less than 100 microns.

15. The method of claim 1, wherein the particle has a dimension less than 10 microns.

16. The method of claim 1, wherein the particle is substantially spherical, the dimension being a particle diameter, the particle diameter being approximately between 2 nanometers and 100 microns.

17. The method of claim 1, wherein the particle is substantially spherical, the dimension being a particle diameter, the particle diameter being approximately between 10 nanometers and 10 microns.

18. The method of claim 1, further comprising forming a particle assembly between the particle and a second particle, the particle assembly having a geometry determined by the non-uniform property of the particle.

19. The method of claim 1, wherein the particle comprises a sub-assembly of smaller particles.

20. The method of claim 1, wherein the particle and the substrate particle are of a single particle type.

21. The method of claim 1, wherein the particle and the substrate particle are of different particle types.

22. A method of forming a particle assembly, the method comprising:
providing a first particle, the first particle having a particle size of between approximately 2 nanometers and 100 microns;
defining a first region and a second region on the first particle by a lithographic process, the first region having a surface property and the second region not having the surface property,
the lithographic process including locating the first particle on a substrate particle so to define a lithographed region masked off by the substrate particle;
providing a second particle; and
disposing the first particle and the second particle in proximity to one another so that the second particle bonds to the first particle so as to form the particle assembly,
the second particle bonding only to the first region having the surface property, and not to the second region.

23. The method of claim 22, wherein the second region is covered by a coating layer, the coating layer not covering the first region.

24. The method of claim 23, wherein the surface property is a surface charge state, the second particle forming an electrostatic bond with the first region of the first particle:
the coating layer modifying surface charge within the second region so as to prevent the second region of the first particle forming a bond with the second particle.

25. The method of claim 24, wherein the coating layer is a polyelectrolyte.

26. The method of claim 22, wherein the surface property is a chemical functionality, the second particle forming a chemical or physical bond with the first region of the first particle.

27. The method of claim 22, wherein the surface property is a biochemical functionality.

28. The method of claim 22, wherein second particle forms a bond with the first particle through a molecular recognition process.

29. The method of claim 22, further comprising:
providing a plurality of first particles;
providing a plurality of second particles; and
forming a plurality of particle assemblies having a substantially uniform geometry using the plurality of first particles and the plurality of second particles.

30. The method of claim 22, wherein the lithographic process includes:
locating the first particle on the substrate particle, the first particle having a particle surface;
providing a surface treatment, the surface treatment modifying the particle surface in an exposed portion of the particle surface and not modifying the particle surface within a lithographed region of the particle surface,
the lithographed region being masked from the surface treatment by proximity to the substrate particle; and
removing the first particle from the substrate particle.

31. The method of claim 22, wherein the first particle and the substrate particle are of a single particle type.

32. The method of claim 22, wherein the first particle and the substrate particle are of different particle types.

33. The method of claim 22, wherein the particle and the substrate particle each comprise a material selected from the group of materials consisting of metals, ceramics, polymers, and semiconductors.

* * * * *

UNITED STATES PATENT AND TRADEMARK OFFICE
CERTIFICATE OF CORRECTION

PATENT NO. : 7,771,787 B2  
APPLICATION NO. : 11/211312  
DATED : August 10, 2010  
INVENTOR(S) : Darrell Velegol et al.

It is certified that error appears in the above-identified patent and that said Letters Patent is hereby corrected as shown below:

Col. 1, line 13: replace "The research carried out in connection with this" with --This--

Col. 1, line 14: replace "supported by National Science Foundation," with --was made with government support under--

Col. 1, line 15: replace "CTS-9984443," with --CTS-9984443 and--

Col. 1, line 15: replace "CCR-0303976" with --CCR-0303976, awarded by the National Science Foundation--

Col. 1, lines 15-16: replace "may have" with --has certain--

Signed and Sealed this
Thirty-first Day of May, 2011

David J. Kappos
*Director of the United States Patent and Trademark Office*